US012294336B2

(12) United States Patent
Hirobe

(10) Patent No.: US 12,294,336 B2
(45) Date of Patent: May 6, 2025

(54) POWER AMPLIFIER CIRCUIT

(71) Applicant: Murata Manufacturing Co., Ltd., Kyoto (JP)

(72) Inventor: Masakazu Hirobe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 573 days.

(21) Appl. No.: 17/650,689

(22) Filed: Feb. 11, 2022

(65) Prior Publication Data

US 2022/0166388 A1     May 26, 2022

Related U.S. Application Data

(63) Continuation of application No. PCT/JP2020/032730, filed on Aug. 28, 2020.

(30) Foreign Application Priority Data

Dec. 20, 2019 (JP) ................. 2019-230973

(51) Int. Cl.
    *H03F 3/04*      (2006.01)
    *H03F 1/02*      (2006.01)
    (Continued)

(52) U.S. Cl.
CPC ........... *H03F 1/302* (2013.01); *H03F 1/0211* (2013.01); *H03F 3/195* (2013.01); *H03F 3/245* (2013.01); *H03F 2200/451* (2013.01)

(58) Field of Classification Search
CPC ........ H03F 1/302; H03F 1/0211; H03F 3/195; H03F 3/245; H03F 2200/451;
(Continued)

(56) References Cited

U.S. PATENT DOCUMENTS 10,291,191 B2 * 5/2019 Teeter ................. H03F 3/21
10,965,255 B1 * 3/2021 Ishihara .............. H03F 3/211
(Continued)

FOREIGN PATENT DOCUMENTS

JP    2002-009558 A    1/2002
JP    2005-073210 A    3/2005
(Continued)

OTHER PUBLICATIONS

International Search Report for PCT/JP2020/032730 dated Nov. 24, 2020.

*Primary Examiner* — Khanh V Nguyen

(74) *Attorney, Agent, or Firm* — McDonald Hopkins LLC

(57) ABSTRACT

A power amplifier circuit includes an amplifier circuit, a bias circuit, a detector, and a control circuit. The amplifier circuit includes a first bipolar transistor. The bias circuit includes an emitter follower. The emitter follower includes a second bipolar transistor and supplies a bias current to the base of the first bipolar transistor. The detector detects the voltage of a power supply terminal connected to the collector of the first bipolar transistor. The control circuit includes a current limiting circuit disposed between a battery terminal and the collector of the second bipolar transistor. The control circuit changes an upper limit value of a control current to be supplied to the collector of the second bipolar transistor, based on the voltage detected by the detector.

13 Claims, 5 Drawing Sheets

(51) Int. Cl.
  *H03F 1/30* (2006.01)
  *H03F 3/195* (2006.01)
  *H03F 3/24* (2006.01)

(58) Field of Classification Search
  CPC ...... H03F 1/0261; H03F 3/04; H03F 2200/18;
     H03F 1/301; H03G 3/3042; H03G 3/3047
  USPC .................................................. 330/285, 296
  See application file for complete search history.

(56) References Cited

U.S. PATENT DOCUMENTS

| | | |
|---|---|---|
| 2001/0054933 A1 | 12/2001 | Miyazawa |
| 2009/0256637 A1 | 10/2009 | Ishihara et al. |
| 2010/0066445 A1 | 3/2010 | Asano |
| 2018/0262165 A1 | 9/2018 | Ishihara et al. |
| 2019/0305736 A1 | 10/2019 | Tahara et al. |

FOREIGN PATENT DOCUMENTS

| | | |
|---|---|---|
| JP | 2009-253918 A | 10/2009 |
| JP | 2010-074542 A | 4/2010 |
| JP | 2018-152714 A | 9/2018 |
| JP | 2019-176454 A | 10/2019 |

\* cited by examiner

POWER AMPLIFIER CIRCUIT

CROSS REFERENCE TO RELATED APPLICATION

This is a continuation of International Application No. PCT/JP2020/032730 filed on Aug. 28, 2020 which claims priority from Japanese Patent Application No. 2019-230973 filed on Dec. 20, 2019. The contents of these applications are incorporated herein by reference in their entireties.

BACKGROUND

The present disclosure generally relates to a power amplifier circuit, and more particularly, to a power amplifier circuit including an amplifier circuit.

Hitherto, a power amplifier module including an amplifier circuit and a bias circuit is known (see Japanese Unexamined Patent Application Publication No. 2018-152714, for example).

The amplifier circuit includes plural cascade-connected amplifiers. The amplifiers each includes a common-emitter transistor. The collector of each common-emitter transistor is connected to a power supply voltage via an inductance element.

The bias circuit includes plural emitter follower transistors and a control integrated circuit (IC). The control IC includes first and second current sources. The first current source supplies a control current, which is varied in accordance with a change of a control voltage, to the collectors of the plural emitter follower transistors. The first current source restricts the control current to a value lower than or equal to the upper limit value. The second current source supplies a constant current to the bases of the plural emitter follower transistors.

BRIEF SUMMARY

In the power amplifier module disclosed in the above-described publication, even though the power supply voltage is maintained at the rated power supply voltage, as output power approaches rated output power, the linearity of the output power characteristics with respect to input power in the amplifier circuit is sometimes decreased. In a power amplifier module, if the linearity of the output power characteristics in an amplifier circuit is decreased, the adjacent channel leakage ratio (ACLR) and the error vector magnitude (EVM) are degraded.

The present disclosure provides a power amplifier circuit that can improve the linearity of output power characteristics with respect to input power in an amplifier circuit.

According to an aspect of the present disclosure, there is provided a power amplifier circuit including an amplifier circuit, a bias circuit, a detector, and a control circuit. The amplifier circuit includes a first bipolar transistor and amplifies and outputs an input signal. The bias circuit includes an emitter follower. The emitter follower includes a second bipolar transistor and supplies a bias current to a base of the first bipolar transistor. The detector detects a voltage of a power supply terminal connected to a collector of the first bipolar transistor. The control circuit includes a current limiting circuit. The current limiting circuit is disposed between a battery terminal and a collector of the second bipolar transistor. The control circuit changes an upper limit value of a control current to be supplied to the collector of the second bipolar transistor, based on the voltage detected by the detector.

In the power amplifier circuit according to the above-described aspect of the disclosure, it is possible to improve the linearity of output power characteristics with respect to input power in the amplifier circuit.

Other features, elements, characteristics and advantages of the present disclosure will become more apparent from the following detailed description of embodiments of the present disclosure with reference to the attached drawings.

DETAILED DESCRIPTION

Figure 1:
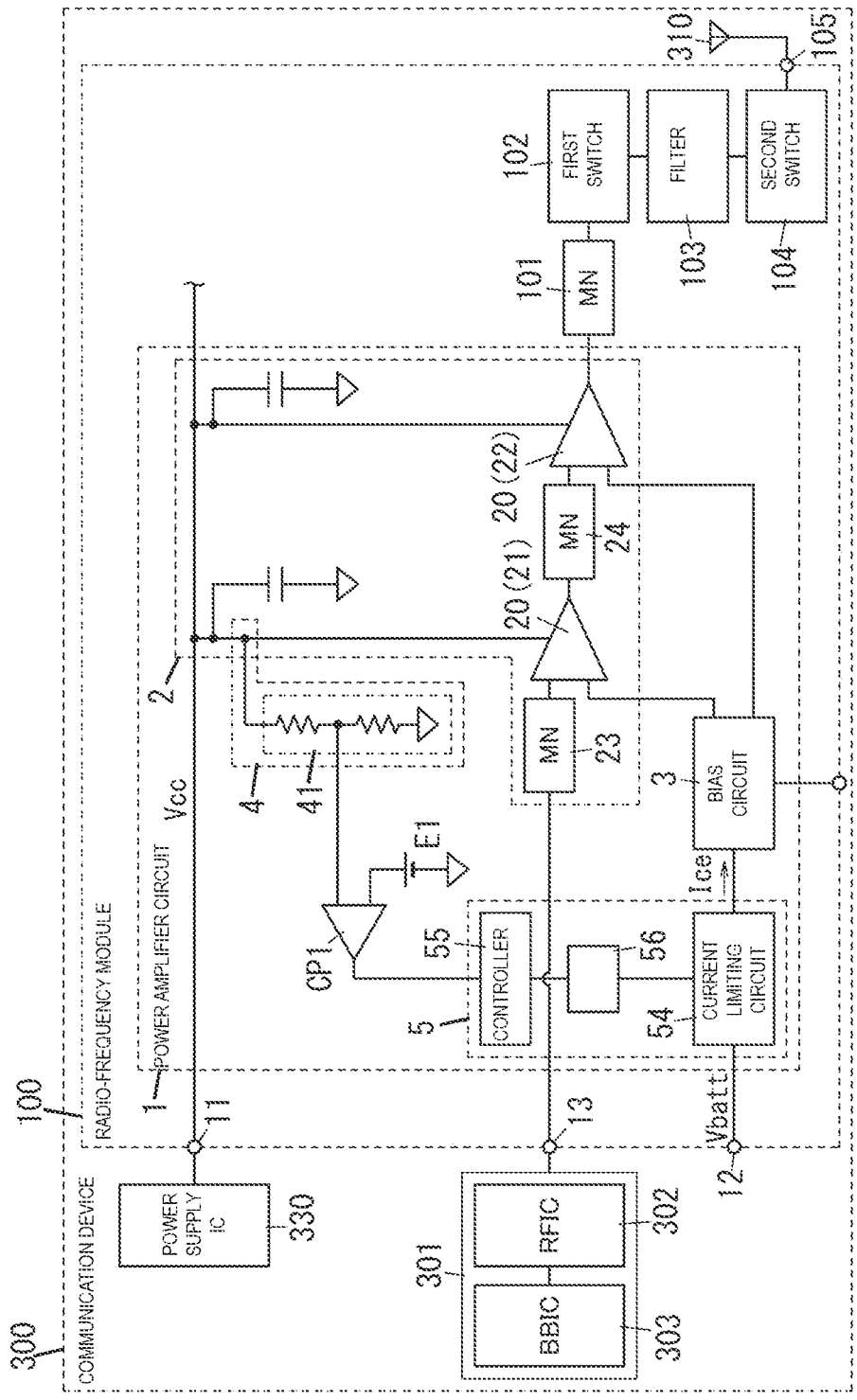
FIG. 1 is a circuit diagram of a radio-frequency circuit (radio-frequency module) including a power amplifier circuit of an embodiment.

A power amplifier circuit 1 according to an embodiment will be described below with reference to FIGS. 1 through 5.

(1) Power Amplifier Circuit and Radio-Frequency Module

(1.1) Circuit Configuration of Radio-Frequency Module Including Power Amplifier Circuit A radio-frequency module 100 including the power amplifier circuit 1 is used in a communication device 300, for example. The communication device 300 is a cellular phone, such as a smartphone, but may be another device, such as a wearable terminal (a smartwatch, for example). The radio-frequency module 100 supports communication standards, such as the fourth generation (4G) and the fifth generation (5G). 4G is Third Generation Partnership Project (3GPP) Long Term Evolution (LTE), for example. 5G is 5G New Radio (NR), for example. The radio-frequency module 100 may also support carrier aggregation and dual connectivity.

The radio-frequency module 100 amplifies a transmit signal received from a signal processing circuit 301 and outputs the amplified signal to an antenna 310 of the communication device 300. The signal processing circuit 301 is not a component of the radio-frequency module 100 but is a component of the communication device 300 including the radio-frequency module 100. The radio-frequency module 100 is controlled by the signal processing circuit 301. The communication device 300 includes the radio-frequency module 100, the signal processing circuit 301, and the antenna 310. The signal processing circuit 301 includes a radio-frequency (RF) signal processing circuit 302 and a baseband signal processing circuit 303. The RF signal processing circuit 302 is a radio-frequency integrated circuit (RFIC), for example, and performs signal processing on a radio-frequency signal. More specifically, the RF signal processing circuit 302 performs signal processing, such as up-conversion, on a radio-frequency signal (transmit signal) output from the baseband signal processing circuit 303 and outputs the transmit signal subjected to signal processing. The baseband signal processing circuit 303 is a baseband integrated circuit (BBIC), for example. The baseband signal processing circuit 303 generates an in (I)-phase signal and a quadrature (Q)-phase signal from a baseband signal, which is an audio signal or an image signal, for example, received from an external source. The baseband signal processing circuit 303 then performs IQ modulation processing by combining the generated I-phase and Q-phase signals and outputs the resulting transmit signal. The transmit signal generated by the baseband signal processing circuit 303 is a modulated signal (IQ signal) generated as a result of a carrier signal of a predetermined frequency being subjected to amplitude modulation with a period longer than that of the carrier signal. The radio-frequency module 100 transfers a radio-frequency signal (transmit signal) between the antenna 310 and the RF signal processing circuit 302 of the signal processing circuit 301.

The radio-frequency module 100 includes the power amplifier circuit 1, an output matching circuit 101, a first switch 102, a filter 103, a second switch 104, and an antenna terminal 105.

The power amplifier circuit 1 includes an amplifier circuit 2. The amplifier circuit 2 amplifies an input signal received from the signal processing circuit 301, for example, and outputs the amplified signal. The input signal is a radio-frequency transmit signal of a predetermined frequency band. The predetermined frequency band includes multiple communication bands different from each other.

The output matching circuit 101 is disposed on a signal path between the amplifier circuit 2 and the first switch 102. The output matching circuit 101 is used for providing impedance matching between the amplifier circuit 2 and the filter 103. The output matching circuit 101 is constituted by one inductor, for example, though it may include plural inductors and plural capacitors.

The first switch 102 is disposed between the output matching circuit 101 and the filter 103. The first switch 102 has a common terminal and plural selection terminals. The common terminal of the first switch 102 is connected to the amplifier circuit 2 via the output matching circuit 101. One of the plural selection terminals of the first switch 102 is connected to the filter 103. The first switch 102 can connect at least one of the selection terminals to the common terminal. That is, the first switch 102 achieves one-to-one connection and one-to-many connection. The first switch 102 is a switch that can switch between plural signal paths for transmit signals of different communication bands. The first switch 102 supports a mobile industry processor interface (MIPI) standard and is a switch integrated circuit (IC), for example. The first switch 102 switches the connection state between the common terminal and the plural selection terminals in accordance with a control signal received from the signal processing circuit 301, for example.

The filter 103 is a filter that uses the transmit band of at least one of the above-described multiple communication bands (Band 3, for example) as the pass band. The filter 103 is a one-chip acoustic wave filter and includes plural series arm resonators and plural parallel arm resonators, each of which is an acoustic wave resonator. The acoustic wave filter is a surface acoustic wave (SAW) filter using SAWs, for example. In this case, each of the plural series arm resonators and plural parallel arm resonators forming the SAW filter is a SAW resonator.

The second switch 104 is disposed between the filter 103 and the antenna terminal 105 and is connected to the antenna terminal 105. The second switch 104 has a common terminal and plural selection terminals. The common terminal of the second switch 104 is connected to the antenna terminal 105. One of the plural selection terminals of the second switch 104 is connected to the filter 103. The second switch 104 supports the MIPI standard and is a switch IC, for example. The second switch 104 switches the connection state between the common terminal and the plural selection terminals in accordance with a control signal received from the signal processing circuit 301, for example.

The antenna terminal 105 is connected to the antenna 310.

In the radio-frequency module 100, a transmit signal output from the amplifier circuit 2 passes through the output matching circuit 101, the first switch 102, the filter 103, the second switch 104, and the antenna terminal 105 and is sent from the antenna 310.

(1.2) Circuit Configuration of Power Amplifier Circuit

Figure 2:
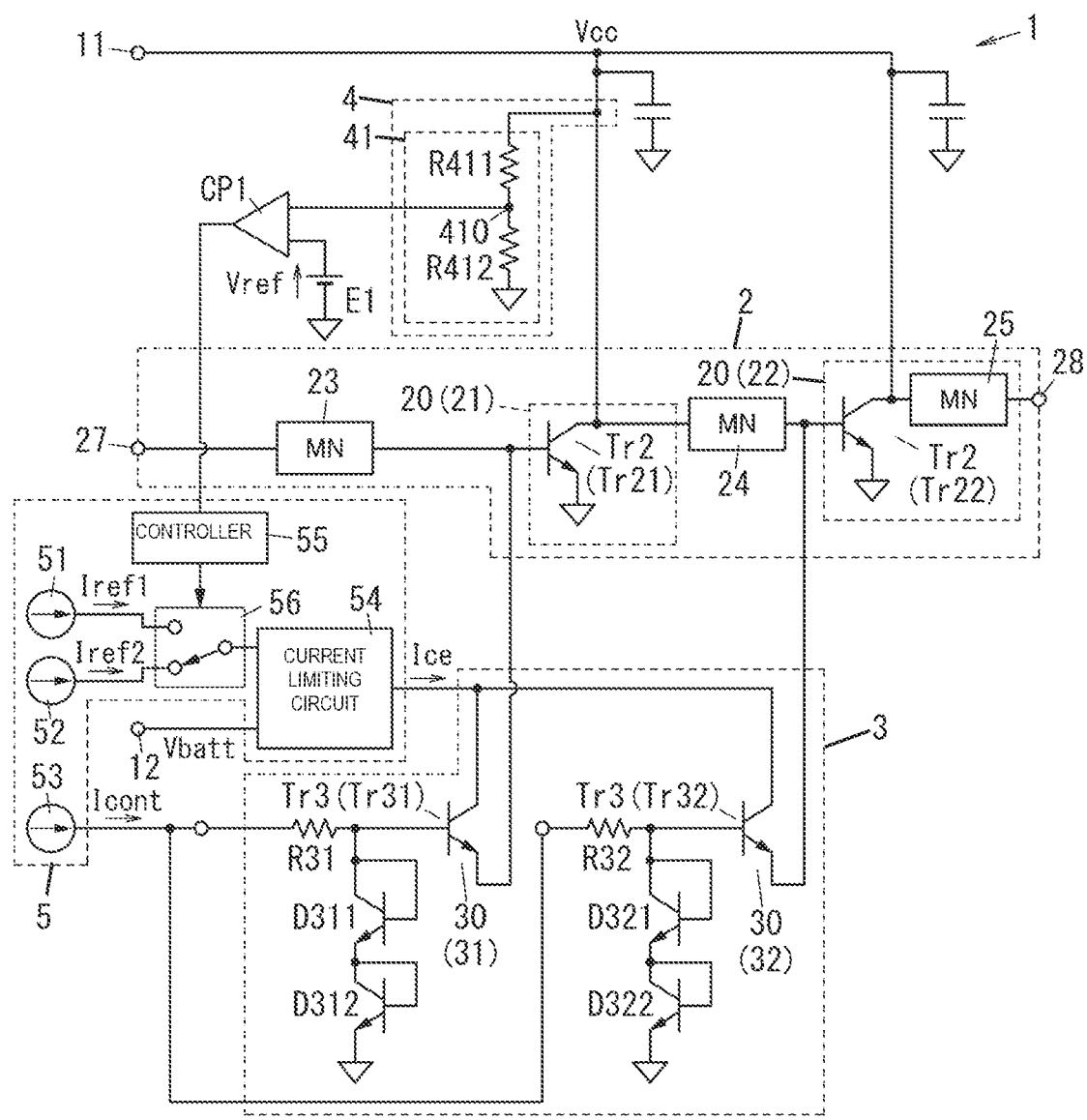
FIG. 2 is a circuit diagram of the power amplifier circuit.

As shown in FIGS. 1 and 2, the power amplifier circuit 1 includes the power amplifier 2, a bias circuit 3, a detector 4, and a control circuit 5. As shown in FIG. 2, the amplifier circuit 2 includes two first bipolar transistors Tr2, which are amplifying transistors, and amplifies and outputs an input signal. The bias circuit 3 includes two emitter followers 30, which correspond to the two respective first bipolar transistors Tr2. Each of the two emitter followers 30 includes a second bipolar transistor Tr3 and supplies a bias current to the base of the corresponding one of the two first bipolar transistors Tr2. The two second bipolar transistors Tr3 are biasing transistors. The detector 4 detects the voltage Vcc of a power supply terminal 11 (hereinafter may also be called the power supply voltage Vcc) connected to the collectors of the first bipolar transistors Tr2. The power supply terminal 11 is connected to a power supply IC 330 of the communication device 300 and receives the power supply voltage Vcc from the power supply IC 330. The control circuit 5 includes a current limiting circuit 54. The current limiting circuit 54 is disposed between a battery terminal 12 and the collectors of the two second bipolar transistors Tr3. The control circuit 5 changes the upper limit value Iup of the control current Icc to be supplied to the collectors of the two second bipolar transistors Tr3 in accordance with the voltage detected by the detector 4. When the bias circuit 3 includes plural (two, in this example) emitter followers 30, the control current Icc is distributed over the plural emitter followers 30.

The amplifier circuit 2 includes an input terminal 27 and an output terminal 28. The amplifier circuit 2 amplifies an input signal (transmit signal), which is output from the signal processing circuit 301 to the input terminal 27 via a signal input terminal 13 of the radio-frequency module 100, and outputs the amplified transmit signal from the output terminal 28. In the amplifier circuit 2, two amplifiers 20 are cascade-connected to each other. Hereinafter, for the sake of description, between the two amplifiers 20, the initial stage (driver stage) of the amplifier 20 may also be called an initial-stage amplifier 21, while the final stage (output stage) of the amplifier 20 may also be called a final-stage amplifier 22. The first bipolar transistor Tr2 of the initial-stage amplifier 21 may be called a first bipolar transistor Tr21, while that of the final-stage amplifier 22 may be called a first bipolar transistor Tr22. The amplifier circuit 2 amplifies an input transmit signal by using the initial-stage amplifier 21 and further amplifies the transmit signal by using the final-stage amplifier 22 and outputs the amplified transmit signal. That is, the final-stage amplifier 22 amplifies the transmit signal amplified by the initial-stage amplifier 21 and outputs the resulting amplified signal.

The amplifier circuit 2 also includes a matching circuit 23 disposed between the input terminal 27 and the initial-stage amplifier 21 and a matching circuit 24 disposed between the initial-stage amplifier 21 and the final-stage amplifier 22. The matching circuit 23 provides impedance matching between the initial-stage amplifier 21 and the signal processing circuit 301. The matching circuit 24 serves as an interstage matching circuit that provides impedance matching between the initial-stage amplifier 21 and the final-stage amplifier 22. In the amplifier circuit 2, the final-stage amplifier 22 may include a matching circuit 25 disposed between the collector of the first bipolar transistor Tr22 and the output terminal 28 of the amplifier circuit 2.

The base of the first bipolar transistor Tr21 is connected to the input terminal 27 via the matching circuit 23. The collector of the first bipolar transistor Tr21 is connected to the power supply terminal 11 and is also connected to the base of the first bipolar transistor Tr22 via the matching circuit 24. The emitter of the first bipolar transistor Tr21 is grounded. The first bipolar transistor Tr21 amplifies a signal input into its base and outputs the amplified signal from its collector.

The base of the first bipolar transistor Tr22 is connected to the collector of the first bipolar transistor Tr21 via the matching circuit 24. The collector of the first bipolar transistor Tr22 is connected to the power supply terminal 11 and is also connected to the output terminal 28 via the matching circuit 25. The emitter of the first bipolar transistor Tr22 is grounded.

The bias circuit 3 includes plural (two, in this example) emitter followers 30, which correspond to plural (two, in this example) respective first bipolar transistors Tr2. Hereinafter, regarding the two emitter followers 30, the emitter follower 30 corresponding to the first bipolar transistor Tr21 may be called an emitter follower 31, while the emitter follower 30 corresponding to the first bipolar transistor Tr22 may be called an emitter follower 32. Regarding the two second bipolar transistors Tr3, the second bipolar transistor Tr3 included in the emitter follower 31 may be called a second bipolar transistor Tr31, while the second bipolar transistor Tr3 included in the emitter follower 32 may be called a second bipolar transistor Tr32.

The base of the second bipolar transistor Tr31 is connected to a third current source 53 via a resistor R31. The emitter of the second bipolar transistor Tr31 is connected to the base of the first bipolar transistor Tr21. The collector of the second bipolar transistor Tr31 is connected to the current limiting circuit 54. The base of the second bipolar transistor Tr32 is connected to the third current source 53 via a resistor R32. The emitter of the second bipolar transistor Tr32 is connected to the base of the first bipolar transistor Tr22. The collector of the second bipolar transistor Tr32 is connected to the current limiting circuit 54. In the bias circuit 3, the control current Icc from the current limiting circuit 54 is supplied to a node between the collectors of the plural second bipolar transistors Tr3.

The amplifier circuit 2 and the bias circuit 3 are included in a single IC chip, such as a GaAs IC chip. In this case, each of the two first bipolar transistors Tr2 is a heterojunction bipolar transistor (HBT), for example.

The IC chip including the amplifier circuit 2 and the bias circuit 3 is not limited to a GaAs IC chip, and may be a Si IC chip including the amplifier circuit 2 or a SiGe IC chip including the amplifier circuit 2.

The detector 4 includes a resistor voltage divider circuit 41 that divides the voltage Vcc of the power supply terminal 11. The power amplifier circuit 1 also includes a comparator CP1 that compares the output voltage of the resistor voltage divider circuit 41 with a threshold voltage Vref. In the power amplifier circuit 1, the output voltage of the resistor voltage divider circuit 41 is used as the voltage detected by the detector 4. The control circuit 5 changes the upper limit value Iup of the control current Icc in accordance with the output from the comparator CP1. The resistor voltage divider circuit 41 is a series circuit of resistors R411 and R412. The resistor voltage divider circuit 41 is disposed between the power supply terminal 11 and a ground such that the resistor R411 is located closer to the power supply terminal 11 and the resistors R412 is located closer to the ground. More specifically, in the resistor voltage divider circuit 41, one end of the resistor R411 is connected to the power supply terminal 11, and the other end thereof is connected to one end of the resistor R412. The other end of the resistor R412 is connected to a ground. An output terminal 410 of the resistor voltage divider circuit 41 is a node between the resistors R411 and R412. The comparator CP1 has first and second input terminals and an output terminal. The first input terminal of the comparator CP1 is connected to the output terminal 410 of the resistor voltage divider circuit 41 (node between the resistors R411 and R412). With this arrangement, the voltage obtained by dividing the power supply voltage Vcc by using the resistors R411 and R412 is applied to the first input terminal of the comparator CP1. The second input terminal of the comparator CP1 is connected to a reference voltage source E1 that outputs the threshold voltage Vref. The output terminal of the comparator CP1 is connected to the controller 55. The comparator CP1 is a comparison circuit that compares the detected voltage output from the detector 4 and the threshold voltage Vref and determines whether the detected voltage exceeds the threshold voltage Vref. The controller 55 may be included in a switching circuit 56. If the detected voltage does not exceed the threshold voltage Vref, the signal level (voltage level) of the signal output from the output terminal 410 is a first level (low level). If the detected voltage exceeds the threshold voltage Vref, the signal level of the signal output from the output terminal 410 is a second level (high level), which is higher than the first level (low level).

The control circuit 5 is a control IC that controls the amplifier circuit 2 and the bias circuit 3. The control circuit 5 supplies the control current Icc to a node between the collectors of the two second bipolar transistors Tr3 of the bias circuit 3. The current limiting circuit 54 of the control circuit 5 limits the upper limit value Iup of the control current Icc to a current value proportional to the magnitude of a reference current Iref input into the current limiting circuit 54. The control circuit 5 includes a first current source 51 and a second current source 52. The first current source 51 can supply a first reference current Iref1 to the current limiting circuit 54 as the reference current. The second current source 52 can supply a second reference current Iref2, which is lower than the first reference current Iref1, to the current limiting circuit 54 as the reference current. If the voltage detected by the detector 4 does not exceed the threshold voltage Vref, the control circuit 5 causes the first current source 51 to supply the first reference current Iref1 to the current limiting circuit 54. If the voltage detected by the detector 4 exceeds the threshold voltage Vref, the control circuit 5 causes the second current source 52 to supply the second reference current Iref2 to the current limiting circuit 54. When the first reference current Iref1 is supplied to the current limiting circuit 54, the upper limit value Iup of the control current Ice is the upper limit value Iup1 (see FIG. 4) determined by the first reference current Iref1. When the second reference current Iref2 is supplied to the current limiting circuit 54, the upper limit value Iup of the control current Ice is the upper limit value Iup2 (see FIG. 4) determined by the second reference current Iref2. The upper limit value Iref2 is smaller than the upper limit value Iref1. The control circuit 5 also includes the third current source 53.

The control circuit 5 also includes the switching circuit 56 and the controller 55. The switching circuit 56 selectively connects the first current source 51 and the second current source 52 to the current limiting circuit 54. The controller 55 controls the switching circuit 56 in accordance with the voltage detected by the detector 4. The switching circuit 56 is a switch having a common terminal 560 and two selection terminals 561 and 562 (see FIG. 3), for example. The common terminal 560 is connected to the current limiting circuit 54. Between the two selection terminals 561 and 562, the selection terminal 561 is connected to the first current source 51, and the other selection terminal 562 is connected to the second current source 52.

The third current source 53 supplies a control current Icont to the bases of the second bipolar transistors Tr31 and Tr32. The control current Icont is a constant current.

The emitter follower 31 supplies a bias current, which is a bias signal for controlling a bias point (operating point) of the initial-stage amplifier 21, from the emitter of the second bipolar transistor Tr31 to the base of the first bipolar transistor Tr21 of the initial-stage amplifier 21.

The emitter follower 32 supplies a bias current, which is a bias signal for controlling a bias point (operating point) of the final-stage amplifier 22, from the emitter of the second bipolar transistor Tr32 to the base of the first bipolar transistor Tr22 of the final-stage amplifier 22.

Two diodes D311 and D312 are connected in series between a ground and the base of the second bipolar transistor Tr31 included in the emitter follower 31. The two diodes D311 and D312 are each formed by connecting the base and the collector of an npn transistor.

Two diodes D321 and D322 are connected in series between a ground and the base of the second bipolar transistor Tr32 included in the emitter follower 32. The two diodes D321 and D322 are each formed by connecting the base and the collector of an npn transistor.

The current limiting circuit 54 limits the current value of the control current Ice to a value proportional to the magnitude of the reference current Iref, and then outputs the limited control current Ice.

Figure 3:
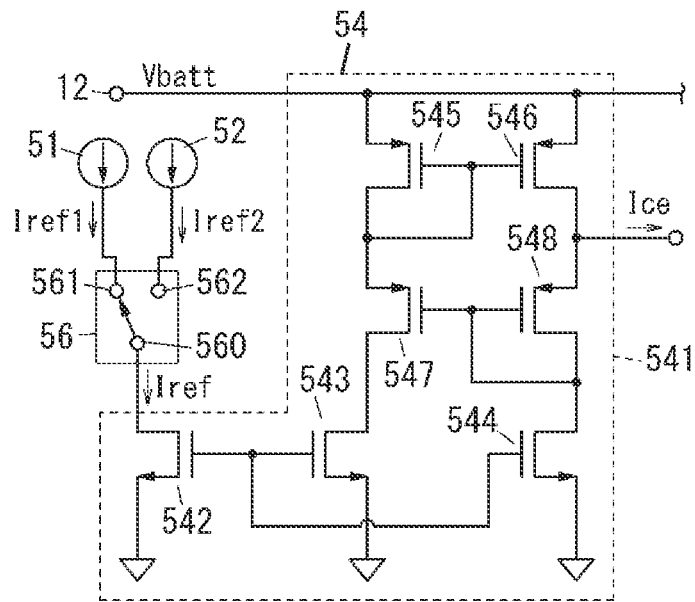
FIG. 3 is a circuit diagram of a current limiting circuit in the power amplifier circuit.

The current limiting circuit 54 is constituted by a current mirror circuit shown in FIG. 3, for example. The current limiting circuit 54 includes three n-channel metal-oxide-semiconductor field effect transistors (MOSFETs) 542, 543, and 544 and four p-channel MOSFETs 545, 546, 547, and 548.

The drain of the n-channel MOSFET 542 can be connected to the first current source 51 and the second current source 52 via the switching circuit 56. The source of the n-channel MOSFET 542 is grounded. The gate of the re-channel MOSFET 542 is connected to the gates of the re-channel MOSFETs 543 and 544. The reference current Iref is input into the drain of the n-channel MOSFET 542.

In the current limiting circuit 54, a series circuit of the p-channel MOSFET 545, the p-channel MOSFET 547, and the n-channel MOSFET 543 is connected between the battery terminal 12 and a ground. In the current limiting circuit 54, a series circuit of the p-channel MOSFET 546, the p-channel MOSFET 548, and the n-channel MOSFET 544 is also connected between the battery terminal 12 and a ground.

The source of the p-channel MOSFET 545 is connected to the battery terminal 12, and the drain thereof is connected to the source of the p-channel MOSFET 547. The source of the p-channel MOSFET 546 is connected to the battery terminal 12, and the drain thereof is connected to the source of the p-channel MOSFET 548. The gate of the p-channel MOSFET 545 is connected to the gate of the p-channel MOSFET 546. The gate of the p-channel MOSFET 547 is connected to the gate of the p-channel MOSFET 548. In the p-channel MOSFET 548, the gate and the drain are connected to each other.

The gates of the n-channel MOSFETs 543 and 544 are connected to the gate of the n-channel MOSFET 542. The drain of the n-channel MOSFET 543 is connected to the drain of the p-channel MOSFET 547. The drain of the n-channel MOSFET 544 is connected to the drain of the p-channel MOSFET 548. The sources of the n-channel MOSFETs 543 and 544 are each connected to a ground.

In the current limiting circuit 54, the control current Ice is output via a current path that branches off from a node of the current path connecting the drain of the p-channel MOSFET 546 and the source of the p-channel MOSFET 548.

A current flowing through the n-channel MOSFET 544 is proportional to a current through the n-channel MOSFET 543. A current flowing through the p-channel MOSFET 546 is proportional to a current through the p-channel MOSFET 545. The current flowing through the p-channel MOSFET 546 is equal to the sum of the current flowing through the re-channel MOSFET 544 and the control current Ice. The current limiting circuit 54 has a function of generating and outputting the control current Ice based on the current flowing through the n-channel MOSFET 543.

The control circuit 5 and the comparator CP1 are included in a single IC chip, such as a Si IC chip.

The control circuit 5 is connected to the signal processing circuit 301, for example. The control circuit 5 controls the amplifier circuit 2 and the bias circuit 3 based on a control signal received from the signal processing circuit 301, more specifically, from the RF signal processing circuit 302. The control circuit 5 supports the MIPI standard, for example.

(1.3) Operation of Power Amplifier Circuit

The power amplifier circuit 1 amplifies and outputs a transmit signal received from the signal processing circuit 301, for example. More specifically, in the power amplifier circuit 1, the amplifier circuit 2 amplifies an input signal, which is a transmit signal of a predetermined frequency band, and outputs the amplified transmit signal.

In the power amplifier circuit 1, when the power supply voltage Vcc of the power supply terminal 11 is a rated power supply voltage, the voltage detected by the detector 4 does not exceed the threshold voltage Vref, and the signal level of the output signal from the comparator CP1 becomes the first level. In this case, the controller 55 connects the selection terminal 561 to the common terminal 560 of the switching circuit 56. As a result, the first reference current Iref1 is supplied to the current limiting circuit 54 as the reference current Iref.

In the power amplifier circuit 1, when the power supply voltage Vcc of the power supply terminal 11 has become higher than the rated power supply voltage by a predetermined voltage (0.5 V, for example) or higher, the voltage detected by the detector 4 exceeds the threshold voltage Vref, and the signal level of the output signal from the comparator CP1 becomes the second level. In this case, the controller 55 connects the selection terminal 562 to the common terminal 560 of the switching circuit 56. As a result, the second reference current Iref2 is supplied to the current limiting circuit 54 as the reference current Iref.

Figure 4:
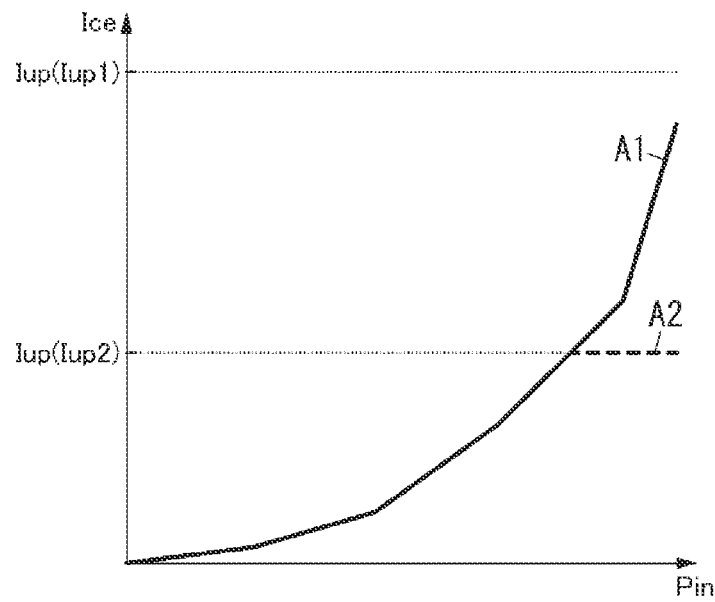
FIG. 4 is a graph illustrating an operation of the power amplifier circuit.
Figure 5:
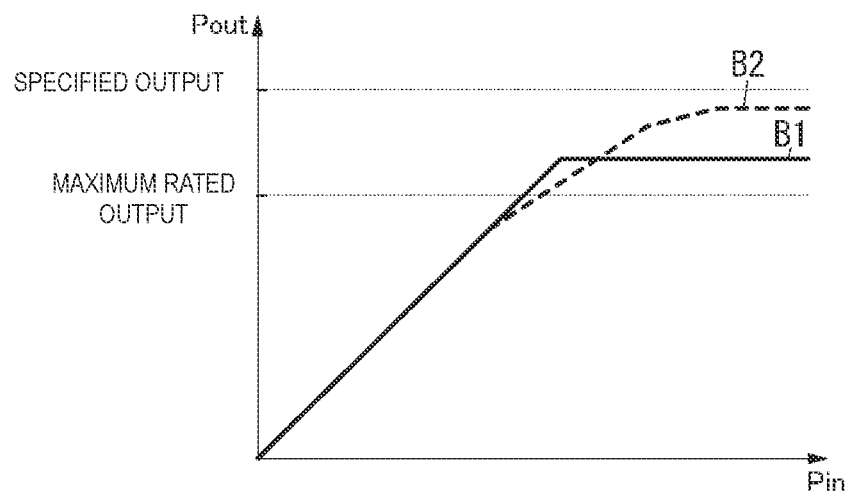
FIG. 5 is a graph illustrating an operation of the power amplifier circuit.

In the power amplifier circuit 1, depending on whether the first reference current Iref1 or the second reference current Iref2 is supplied to the current limiting circuit 54 as the reference current Iref, the control current Ice characteristics with respect to input power Pin in the amplifier circuit 2 become different, as shown in FIG. 4, and the output power Pout characteristics with respect to input power Pin in the amplifier circuit 2 become different, as shown in FIG. 5.

When the first reference current Iref1 is supplied to the current limiting circuit 54, the control current Ice can safely flow through the bias circuit 3 as the input power Pin of the amplifier circuit 2 increases as long as the control current Ice is lower than the upper limit value Iup1, as indicated by the solid line A1 in FIG. 4. That is, as the input power Pin of the amplifier circuit 2 increases, the control current Ice also rises but not more than the upper limit value Iup1. With such control current Ice characteristics, when the power supply voltage Vcc is the rated power supply voltage and when the output power Pout of the amplifier circuit 2 is smaller than or equal to the maximum rated output, the output power Pout with respect to the input power Pin in the power amplifier 2 becomes linear, as indicated by the solid line B1 in FIG. 5. In the power amplifier circuit 1, when the power supply voltage Vcc is the rated power supply voltage, the output power Pout of the amplifier circuit 2 is saturated at a value higher than the maximum rated output and lower than specified power. Specified power is a level of power that causes a breakdown in a circuit element whose electric power handling capability is lower than the other circuit elements in the radio-frequency module 100, except for the power amplifier circuit 1. An example of such a circuit element is the filter 103. In other words, an example of the level of specified power is the electric power handing capability of the filter 103.

When the second reference current Iref2 is supplied to the current limiting circuit 54, the control current Ice is restricted to the upper limit value Iup2 determined by the second reference current Iref2 when the input power Pin of the amplifier circuit 2 becomes greater, as indicated by the broken line A2 in FIG. 4. In other words, when the control current Ice rises to the upper limit value Iup2, it is maintained at the upper limit value Iup2 even if the input power Pin of the power amplifier 2 increases. With this configuration, when the power supply voltage Vcc is higher than the rated power supply voltage by a predetermined voltage (0.1 to 0.2 V, for example), the output power Pout of the power amplifier 2 is saturated at a value higher than the maximum rated output and lower than specified power, as indicated by the broken line B2 in FIG. 5. In the power amplifier circuit 1, when the power supply voltage Vcc is the rated power supply voltage, the output power Pout of the amplifier circuit 2 is saturated at a value higher than the maximum rated output and lower than specified power. Specified power is a level of power that causes a breakdown in a circuit element whose electric power handling capability is lower than the other circuit elements in the radio-frequency module 100, except for the power amplifier circuit 1. An example of such a circuit element is the filter 103. In other words, an example of the level of specified power is the electric power handing capability of the filter 103.

(2) Conclusions

The power amplifier circuit 1 according to the embodiment includes the amplifier circuit 2, the bias circuit 3, the detector 4, and the control circuit 5. The amplifier circuit 2 includes the first bipolar transistor Tr2 and amplifies and outputs an input signal. The bias circuit 3 includes the emitter follower 30. The emitter follower 30 includes the second bipolar transistor Tr3. The emitter follower 30 supplies a bias current to the base of the first bipolar transistor Tr2. The detector 4 detects the voltage Vcc of the power supply terminal 11 connected to the collector of the first bipolar transistor Tr2. The control circuit 5 includes the current limiting circuit 54. The current limiting circuit 54 is disposed between the battery terminal 12 and the collector of the second bipolar transistor Tr3. The control circuit 5 changes the upper limit value Iup of the control current Ice to be supplied to the collector of the second bipolar transistor Tr3 in accordance with the voltage detected by the detector 4.

The power amplifier circuit 1 of the embodiment can improve the linearity of the output power Pout characteristics with respect to the input power Pin in the amplifier circuit 2. That is, when the power amplifier circuit 1 is operating under the condition that the power supply voltage Vcc is the rated power supply voltage and the output power Pout of the amplifier circuit 2 is smaller than or equal to the maximum rated output, the linearity of the output power characteristics with respect to input power can be enhanced, thereby making it less likely to degrade the ACLR and EVM.

Even when the power supply voltage Vcc has become higher than the rated power supply voltage by a predetermined voltage, the power amplifier circuit 1 of the embodiment can restrict the output power Pout of the amplifier circuit 2 to a value which does not exceed specified power, which is higher than the maximum rated output. It is now assumed that the control current Icont is restricted instead of the control current Ice. In this case, even with a slight change in the base-emitter voltage of the second bipolar transistor Tr3 of the emitter follower 30 under large-signal operation, the control current Ice increases. This makes it difficult to restrict the output power Pout of the amplifier circuit 2 with high precision. In contrast, in the power amplifier circuit 1 of the embodiment, the control current Ice is restricted to the upper limit value Iup. Hence, even if the base-emitter voltage of the second bipolar transistor Tr3 of the emitter follower 30 is dropped under large-signal operation, the base current flowing through the base of the first bipolar transistor Tr2 of the amplifier circuit 2 does not exceed the threshold of the control current Ice. As a result, in the power amplifier circuit 1 of the embodiment, the output power Pout can be restricted to the upper limit value Iup with higher precision than when the control current Icont is restricted instead of the control current Ice. In the power amplifier circuit 1, the bias current flowing through the first bipolar transistor Tr2 of the amplifier circuit 2 is less vulnerable to variations of the output short-circuit current gain $h_{fe}$ of the emitter follower 30 than when the control current Icont is restricted instead of the control current Ice.

The radio-frequency module 100 including the power amplifier circuit 1 includes plural circuit elements (such as a GaAs IC chip and a Si IC chip of the power amplifier circuit 1, the first switch 102, the filter 103, and the second switch 104) contained in the radio-frequency module 100 and a substrate having these plural circuit elements mounted thereon. To reduce the size of the radio-frequency module 100, the size of the filter 103, which is more likely to occupy the area of the substrate than the other circuit elements, may be reduced. The electric power handling capability of the filter 103 tends to become lower as the chip size of the filter 103 is smaller. In the power amplifier circuit 1 of the embodiment, the output power Pout of the amplifier circuit 2 can be restricted to a value which does not exceed specified power, which is higher than the maximum rated output. This makes it less likely to cause a breakdown in the filter 103 and to accordingly increase the design margin of the filter 103. The specified power can be determined based on the lowest electric power handling capability of a circuit element in the radio-frequency module 100.

(3) Modified Examples of Power Amplifier Circuit (3.1) First Modified Example

Figure 6:
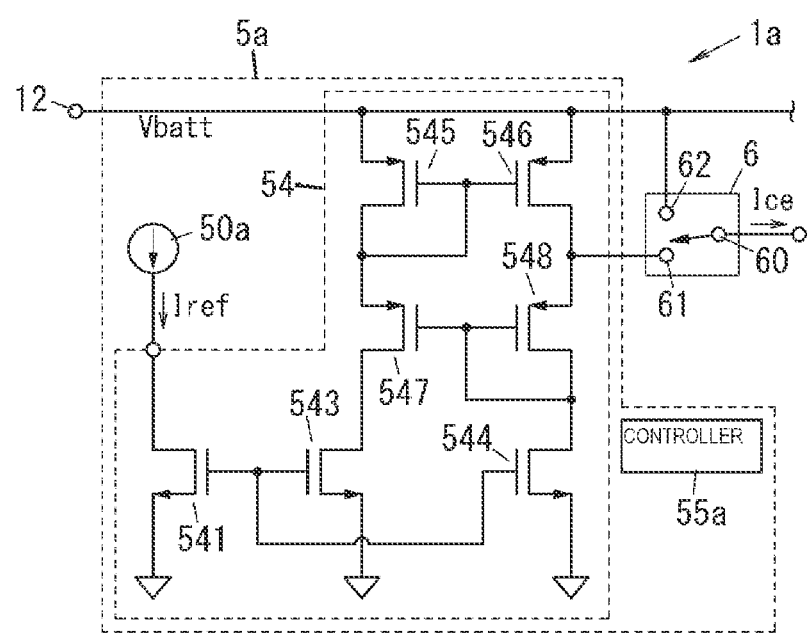
FIG. 6 is a circuit diagram of a current limiting circuit in a power amplifier circuit of a first modified example of the embodiment.

A power amplifier circuit 1a according to a first modified example of the embodiment will be described below with reference to FIG. 6. Elements of the power amplifier circuit 1a similar to those of the power amplifier circuit 1 of the embodiment are designated by like reference numerals, and an explanation thereof will be omitted. In FIG. 6, the amplifier circuit 2, the bias circuit 3, the detector 4, and the comparator CP1 are not shown.

The power amplifier circuit 1a of the first modified example is different from the power amplifier circuit 1 of the embodiment in that it includes a control circuit 5a instead of the control circuit 5 and a switching circuit 6 is disposed outside the control circuit 5a.

The control circuit 5a includes a current source 50a instead of a set of the first and second current sources 51 and 52 and the switching circuit 56 included in the control circuit 5. The current source 50a supplies a reference current Iref to the current limiting circuit 54. The magnitude of the reference current Iref is equal to the second reference current Iref2 supplied from the second current source 52 to the current limiting circuit 54 in the power amplifier circuit 1 of the embodiment, for example.

The switching circuit 6 has a common terminal 60 and two selection terminals 61 and 62. The common terminal 60 is connected to the collector of the second bipolar transistor Tr3 of each emitter follower 30. The selection terminal 61 is connected to the output terminal of the current limiting circuit 54. In the example in FIG. 6, the selection terminal 61 is connected to a node on the current path between the drain of the p-channel MOSFET 546 and the source of the p-channel MOSFET 548. The selection terminal 62 is connected to the battery terminal 12 without necessarily passing through the current limiting circuit 54. This means that the selection terminal 62 is connected to the battery terminal 12 without necessarily passing through any of the plural circuit elements of the current limiting circuit 54.

The control circuit 5a includes a controller 55a instead of the controller 55 of the control circuit 5 of the power amplifier circuit 1. The switching circuit 6 switches the connection state between the common terminal 60 and the two selection terminals 61 and 62 in accordance with a control signal received from the controller 55a, for example. In short, the switching circuit 6 mutually exclusively connects the current limiting circuit 54 and the battery terminal 12 to the collector of the second bipolar transistor Tr3 of the emitter follower 30 (see FIG. 2).

When the voltage detected by the detector 4 exceeds the threshold voltage Vref, the control circuit 5a controls the switching circuit 6 to connect the battery terminal 12 to the collector of the second bipolar transistor Tr3 of the emitter follower 30 via the current limiting circuit 54. When the voltage detected by the detector 4 does not exceed the threshold voltage Vref, the control circuit 5a controls the switching circuit 6 to connect the battery terminal 12 to the collector of the second bipolar transistor Tr3 of the emitter follower 30 without necessarily having the current limiting circuit 54 interposed therebetween. In the second case, the control circuit 5a causes the current source 50a to stop supplying the reference current Iref to the current limiting circuit 54. In the control circuit 5a, the controller 55a controls the switching circuit 6 in accordance with an output signal from the comparator CP1 (see FIG. 2).

In the power amplifier circuit 1a of the first modified example, when the battery terminal 12 is connected to the collector of the second bipolar transistor Tr3 of the emitter follower 30 without necessarily having the current limiting circuit 54 interposed therebetween, the control current Ice characteristics and the output power Pout characteristics respectively become similar to those indicated by the solid line A1 in FIG. 4 and those indicated by the solid line B1 in FIG. 5. When the battery terminal 12 is connected to the collector of the second bipolar transistor Tr3 of the emitter follower 30 via the current limiting circuit 54, the control current Ice characteristics and the output power Pout characteristics respectively become similar to those indicated by the broken line A2 in FIG. 4 and those indicated by the broken line B2 in FIG. 5.

In the power amplifier circuit 1a of the first modified example, as well as in the power amplifier circuit 1 of the embodiment, the control circuit 5a changes the upper limit value Iup of the control current Ice to be supplied to the collector of the second bipolar transistor Tr3 (see FIG. 2) in accordance with the voltage detected by the detector 4. This enables the power amplifier circuit 1a, as well as the power amplifier circuit 1, to improve the linearity of the output power Pout characteristics with respect to the input power Pin in the amplifier circuit 2 (see FIG. 2).

(3.2) Second Modified Example

Figure 7:
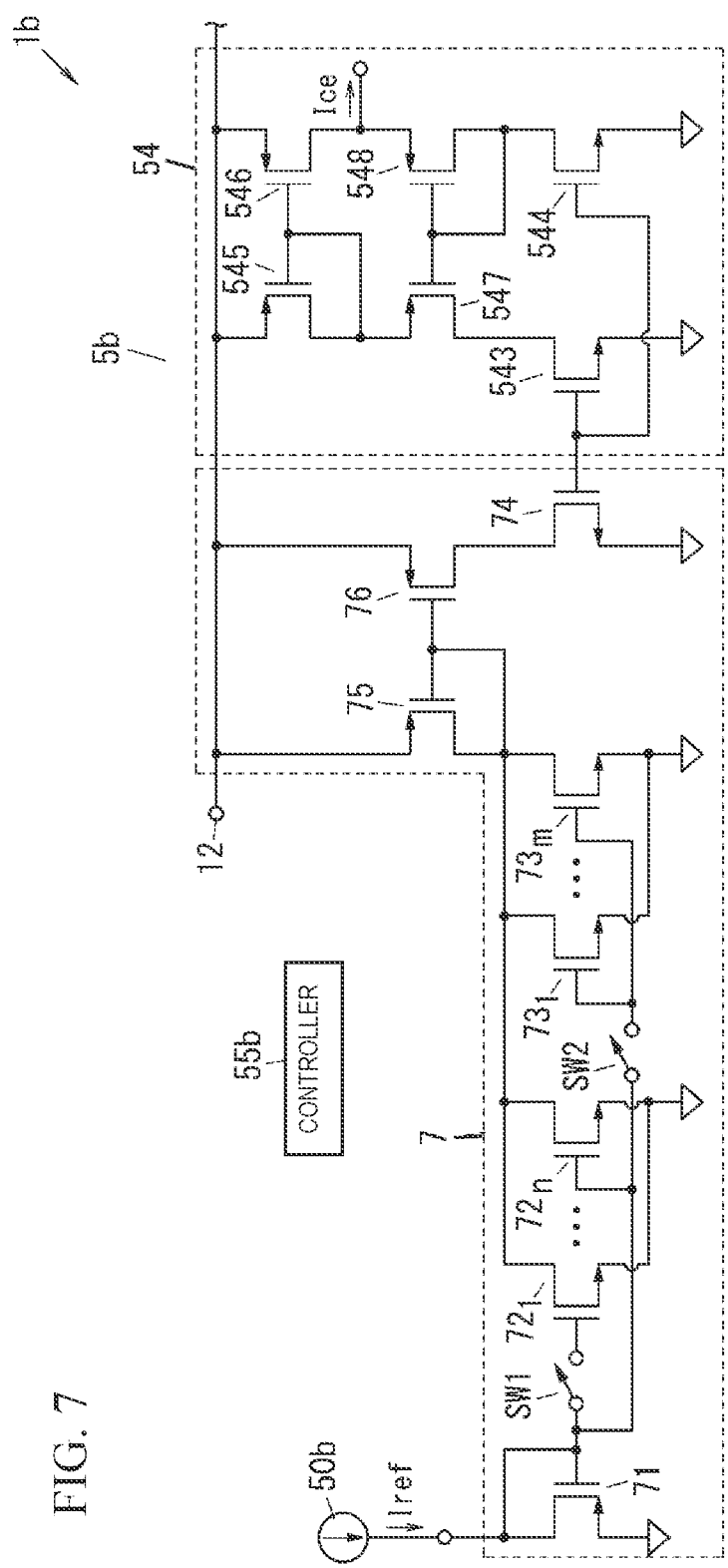
FIG. 7 is a circuit diagram of a current limiting circuit in a power amplifier circuit of a second modified example of the embodiment.

A power amplifier circuit 1b according to a second modified example of the embodiment will be described below with reference to FIG. 7. Elements of the power amplifier circuit 1b similar to those of the power amplifier circuit 1 of the embodiment are designated by like reference numerals, and an explanation thereof will be omitted. In FIG. 7, the amplifier circuit 2, the bias circuit 3, the detector 4, and the comparator CP1 are not shown.

The power amplifier circuit 1b of the second modified example is different from the power amplifier circuit 1 of the embodiment in that it includes a control circuit 5b. The control circuit 5b includes a current source 50b and a switcher 7, instead of a set of the first and second current sources 51 and 52, the switching circuit 56, and the n-channel MOSFET 542 of the current limiting circuit 54 of the control circuit 5 of the power amplifier circuit 1.

The switcher 7 is disposed between the current source 50b and the current limiting circuit 54. The switcher 7 is a current mirror circuit whose mirror ratio is changeable. The switcher 7 includes an n-channel MOSFET 71, n (n is an integer or two or greater) n-channel MOSFETs $72_1$ through $72_n$, m (m is an integer or two or greater) n-channel MOSFETs $73_1$ through $73_m$, two p-channel MOSFETs 75 and 76, an n-channel MOSFET 74, and two switches SW1 and SW2.

The drain of the n-channel MOSFET 71 is connected to the current source 50b. The drain and the gate of the re-channel MOSFET 71 are connected to each other. The source of the n-channel MOSFET 71 is connected to a ground. The gate of the n-channel MOSFET 71 is connected to the gate of the n-channel MOSFET $72_1$ via the switch SW1. The drains of the n n-channel MOSFETs $72_1$ through $72_n$ and the drains of the m n-channel MOSFETs $73_1$ through $73_m$ are connected to the drain of the p-channel MOSFET 75. The sources of the n re-channel MOSFETs $72_1$ through $72_n$ and the sources of the m re-channel MOSFETs $73_1$ through $73_m$ are connected to a ground. A node of the gates of the m n-channel MOSFETs $73_1$ through $73_m$ is connected to the gate of the n-channel MOSFET $72_n$ via the switch SW2. The gate of the n-channel MOSFET $72_n$ is connected to the gate of the n-channel MOSFET $72_1$ via the switch SW1. The drain and the gate of the p-channel MOSFET 75 are connected to each other. The gate of the p-channel MOSFET 75 is connected to the gate of the p-channel MOSFET 76. The sources of the p-channel MOSFETs 75 and 76 are connected to the battery terminal 12. The drain of the p-channel MOSFET 76 is connected to the drain of the n-channel MOSFET 74. The source of the n-channel MOSFET 74 is connected to a ground. The gate of the n-channel MOSFET 74 is connected to the gate of the n-channel MOSFET 543 of the current limiting circuit 54.

In the switcher 7, when the switch SW2 is ON and the switch SW1 is OFF, the mirror ratio is smaller than that when the switch SW2 is OFF and the switch SW1 is ON.

The control circuit 5b includes a controller 55b instead of the controller 55 of the control circuit 5. The switcher 7 changes the connection state of each of the switches SW1 and SW2 in accordance with a control signal received from the controller 55b, for example. That is, the switcher 7 can change the magnitude of a current to flow through the n-channel MOSFET 74 connected to the n-channel MOSFET 543 of the current limiting circuit 54. The magnitude of the current to flow through the n-channel MOSFET 74 is determined by the reference current Iref and the mirror ratio of the switcher 7.

When the voltage detected by the detector 4 does not exceed the threshold voltage Vref, the control circuit 5b controls the switcher 7 so that the switch SW2 is OFF and the switch SW1 is ON. When the voltage detected by the detector 4 exceeds the threshold voltage Vref, the control circuit 5b controls the switcher 7 so that the switch SW2 is ON and the switch SW1 is OFF. In the control circuit 5b, the controller 55b controls the switcher 7 in accordance with an output signal from the comparator CP1.

In the power amplifier circuit 1b of the second modified example, as well as in the power amplifier circuit 1 of the embodiment, the control circuit 5b changes the upper limit value Iup of the control current Ice to be supplied to the collector of the second bipolar transistor Tr3 (see FIG. 2) in accordance with the voltage detected by the detector 4. This enables the power amplifier circuit 1b, as well as the power amplifier circuit 1, to improve the linearity of the output power Pout characteristics with respect to the input power Pin in the amplifier circuit 2 (see FIG. 2). In the power amplifier circuit 1b of the second modified example, the switch SW2 of the switcher 7 may be omitted, and the upper limit value Iup of the control current Ice may be changed by turning ON/OFF the switch SW1.

In the power amplifier circuit 1b, the control circuit 5b may change the upper limit value Iup of the control current Ice in accordance with the frequency band of an input signal to be amplified by the amplifier circuit 2. In this case, the controller 55b controls the switcher 7 to change the upper limit value Iup of the control current Ice.

In the power amplifier circuits 1, 1a, and 1b, the control circuits 5, 5a, and 5b may change the threshold voltage Vref in accordance with the rated power supply voltage of the power supply terminal 11 (see FIG. 2). In this case, a variable power supply is used as the reference voltage source E1, for example, and the controllers 55, 55a, and 55b change the threshold voltage Vref in accordance with the rated power supply voltage corresponding to the voltage detected by the detector 4.

Other Modified Examples

The above-described embodiment is only an example of the present disclosure. Various changes may be made to the embodiment in accordance with some factors, such as the design, as long as the object of the disclosure is achievable.

For example, in the amplifier circuit 2 of the power amplifier circuit 1, two amplifiers 20 are cascade-connected to each other. However, three or more amplifiers 20 may be cascade-connected to each other. The amplifier circuit 2 may not necessarily include plural cascade-connected amplifiers 20 and include at least one amplifier 20. That is, in the power amplifier circuit 1, the amplifier circuit 2 may include only one first bipolar transistor Tr2, in which case, the bias circuit 3 may include one emitter follower 30 and one second bipolar transistor Tr3.

In the radio-frequency module 100, the filter 103 is an acoustic wave filter using SAWs. Alternatively, the filter 103 may be an acoustic wave filter using boundary acoustic waves or longitudinal waves.

Each of the plural series arm resonators and plural parallel arm resonators forming the acoustic wave filter is not restricted to a SAW resonator, and may be another type of resonator, such as a bulk acoustic wave (BAW) resonator.

The radio-frequency module 100 may include a receive circuit having a low-noise amplifier that amplifies a received signal input from the antenna terminal 105 and a filter connected to the low-noise amplifier.

The filter 103 is not restricted to a transmit filter and may be a duplexer.

In the radio-frequency module 100, the first switch 102 and the second switch 104 may be switch ICs supporting general-purpose input output (GPIO).

(Aspects)

The specification discloses the following aspects.

According to a first aspect, a power amplifier circuit 1, 1a, or 1b includes an amplifier circuit 2, a bias circuit 3, a detector 4, and a control circuit 5, 5a, or 5b. The amplifier circuit 2 includes a first bipolar transistor Tr2 and amplifies and outputs an input signal. The bias circuit 3 includes an emitter follower 30. The emitter follower 30 includes a second bipolar transistor Tr3 and supplies a bias current to the base of the first bipolar transistor Tr2. The detector 4 detects the voltage Vcc of a power supply terminal 11 connected to the collector of the first bipolar transistor Tr2. The control circuit 5, 5a, or 5b includes a current limiting circuit 54. The current limiting circuit 54 is disposed between a battery terminal 12 and the collector of the second bipolar transistor Tr3. The control circuit 5, 5a, or 5b changes the upper limit value of a control current Ice to be supplied to the collector of the second bipolar transistor Tr3, based on the voltage detected by the detector 4.

According to the first aspect, the power amplifier circuit 1, 1a, or 1b is able to improve the linearity of the output power Pout characteristics with respect to the input power Pin in the amplifier circuit 2.

According to a second aspect, in the power amplifier circuit 1, 1a, or 1b according to the first aspect, the control circuit 5, 5a, or 5b decreases the upper limit value of the control current Ice when the voltage detected by the detector 4 is greater than the threshold voltage Vref corresponding to the rated power supply voltage of the power supply terminal 11.

According to the second aspect, when the power supply voltage Vcc has become higher than the rated power supply voltage by a predetermined voltage, the power amplifier circuit 1, 1a, or 1b is able to prevent the output power Pout of the amplifier circuit 2 from being increased.

According to a third aspect, in the power amplifier circuit 1 according to the second aspect, the current limiting circuit 54 limits the upper limit value of the control current Ice to be a current value proportional to the magnitude of a reference current Iref input into the current limiting circuit 54. The control circuit 5 includes a first current source 51 and a second current source 52. The first current source 51 is able to supply a first reference current Iref1 to the current limiting circuit 54 as the reference current Iref. The second current source 52 is able to supply a second reference current Iref2 to the current limiting circuit 54 as the reference current Iref. The value of the second reference current Iref2 is smaller than that of the first reference current Iref1. When the voltage detected by the detector 4 does not exceed the threshold voltage Vref, the control circuit 5 causes the first current source 51 to supply the first reference current Iref1 to the current limiting circuit 54. When the voltage detected by the detector 4 exceeds the threshold voltage Vref, the control circuit 5 causes the second current source 52 to supply the second reference current Iref2 to the current limiting circuit 54.

According to the third aspect, the control current Ice can be changed in accordance with whether the first reference current Iref1 or the second reference current Iref2 is supplied to the current limiting circuit 54 as the reference current Iref.

According to a fourth aspect, in the power amplifier circuit 1 according to the third aspect, the control circuit 5 further includes a switching circuit 56 and a controller 55. The switching circuit 56 selectively connects the first and second current sources 51 and 52 to the current limiting circuit 54. The controller 55 controls the switching circuit 56 in accordance with the voltage detected by the detector 4.

According to the fourth aspect, the power amplifier circuit 1 is able to selectively connect the first and second current sources 51 and 52 to the current limiting circuit 54.

According to a fifth aspect, the power amplifier circuit 1a according to the second aspect further includes a switching circuit 6. The switching circuit 6 mutually exclusively connects the current limiting circuit 54 and the battery terminal 12 to the collector of the second bipolar transistor Tr3. When the voltage detected by the detector 4 exceeds the threshold voltage Vref, the control circuit 5a controls the switching circuit 6 to connect the battery terminal 12 to the collector of the second bipolar transistor Tr3 via the current limiting circuit 54. When the voltage detected by the detector 4 does not exceed the threshold voltage Vref, the control circuit 5a controls the switching circuit 6 to connect the battery terminal 12 to the collector of the second bipolar transistor Tr3 without necessarily having the current limiting circuit 54 therebetween.

According to the fifth aspect, when the voltage detected by the detector 4 does not exceed the threshold voltage Vref, the current limiting circuit 54 is not used. This can improve the linearity of the output power Pout characteristics with respect to the input power Pin in the amplifier circuit 2.

According to a sixth aspect, in the power amplifier circuit 1, 1a, or 1b according to one of the second through fifth aspects, the detector 4 includes a resistor voltage divider circuit 41 that divides the voltage Vcc of the power supply terminal 11. The power amplifier circuit 1, 1a, or 1b also includes a comparator CP1 that compares an output voltage of the resistor voltage divider circuit 41 with the threshold voltage Vref. The control circuit 5, 5a, or 5b changes the upper limit value of the control current Ice in accordance with output of the comparator CP1.

According to the sixth aspect, the value of the threshold voltage Vref can be made smaller than when the voltage Vcc of the power supply terminal 11 is directly input into the comparator CP1.

According to a seventh aspect, in the power amplifier circuit 1, 1a, or 1b according to the sixth aspect, the amplifier circuit 2 includes plural first bipolar transistors Tr2 that are cascade-connected to each other. The resistor voltage divider circuit 41 is connected to the power supply terminal 11 via the collector of the initial stage of the first bipolar transistor Tr2 (first bipolar transistor Tr2l) among the plural first bipolar transistors Tr2.

According to the seventh aspect, the radio-frequency characteristics are less likely to be degraded.

According to an eighth aspect, in the power amplifier circuit 1b according to one of the first through seventh aspects, the control circuit 5b changes the upper limit value of the control current Ice in accordance with the frequency band of the input signal to be amplified by the amplifier circuit 2.

According to the eighth aspect, as the frequency band of the input signal is higher, the upper limit value of the control current Ice can be made greater. This makes it easier for the power amplifier circuit 1b to handle high power user equipment (HPUE).

According to a ninth aspect, in the power amplifier circuit 1, 1a, or 1b according to one of the second through fifth aspects, the control circuit 5 changes the threshold voltage Vref in accordance with the rated power supply voltage of the power supply terminal 11.

According to the ninth aspect, the power amplifier circuit 1, 1a, or 1b is able to improve the linearity of the output power Pout characteristics with respect to the input power Pin in the amplifier circuit 2, regardless of the rated power supply voltage of the power supply terminal 11.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A power amplifier circuit comprising:
an amplifier circuit that comprises a first bipolar transistor, and that is configured to amplify an input signal and to output an amplified signal;

a bias circuit that comprises an emitter follower, the emitter follower comprising a second bipolar transistor and being configured to supply a bias current to a base of the first bipolar transistor;

a detector configured to detect a voltage of a power supply terminal, the power supply terminal being connected to a collector of the first bipolar transistor; and a control circuit that comprises a current limiting circuit connected between a battery terminal and a collector of the second bipolar transistor, wherein the control circuit is configured to change an upper limit of a control current supplied to the collector of the second bipolar transistor, based on the voltage detected by the detector.

2. The power amplifier circuit according to claim 1, wherein the control circuit is configured to decrease the upper limit of the control current when the voltage detected by the detector is greater than a threshold voltage, the threshold voltage corresponding to a rated power supply voltage of the power supply terminal.

3. The power amplifier circuit according to claim 2, wherein:

the current limiting circuit is configured to limit the upper limit of the control current to be a current value proportional to a magnitude of a first reference current or a second reference current, the first reference current and the second reference current being selectively input into the current limiting circuit;

the control circuit comprises:
a first current source that is configured to supply the first reference current to the current limiting circuit, and
a second current source that is configured to supply the second reference current to the current limiting circuit, a value of the second reference current being less than a value of the first reference current;

the control circuit is configured to receive the first reference current when the voltage detected by the detector does not exceed the threshold voltage; and the control circuit is configured to receive the second reference current when the voltage detected by the detector exceeds the threshold voltage.

4. The power amplifier circuit according to claim 3, wherein the control circuit further comprises:

a switching circuit configured to selectively connect the first or second current source to the current limiting circuit, and a controller that is configured to control the switching circuit in accordance with the voltage detected by the detector.

5. The power amplifier circuit according to claim 2, further comprising:

a switching circuit that is configured to mutually exclusively connect the current limiting circuit and the battery terminal to the collector of the second bipolar transistor, wherein, when the voltage detected by the detector exceeds the threshold voltage, the control circuit is configured to control the switching circuit to connect the battery terminal to the collector of the second bipolar transistor via the current limiting circuit, and wherein, when the voltage detected by the detector does not exceed the threshold voltage, the control circuit is configured to control the switching circuit to connect the battery terminal to the collector of the second bipolar transistor without the current limiting circuit between the battery terminal and the collector of the second bipolar transistor.

6. The power amplifier circuit according to claim 2, wherein:

the detector comprises:
a resistor voltage divider circuit configured to divide the voltage of the power supply terminal, and
a comparator configured to compare an output voltage of the resistor voltage divider circuit with the threshold voltage; and the control circuit is configured to change the upper limit of the control current in accordance with an output of the comparator.

7. The power amplifier circuit according to claim 3, wherein:

the detector comprises:
a resistor voltage divider circuit configured to divide the voltage of the power supply terminal, and
a comparator configured to compare an output voltage of the resistor voltage divider circuit with the threshold voltage; and the control circuit is configured to change the upper limit of the control current in accordance with an output of the comparator.

8. The power amplifier circuit according to claim 5, wherein:

the detector comprises:
a resistor voltage divider circuit configured to divide the voltage of the power supply terminal, and
a comparator configured to compare an output voltage of the resistor voltage divider circuit with the threshold voltage; and the control circuit is configured to change the upper limit of the control current in accordance with an output of the comparator.

9. The power amplifier circuit according to claim 6, wherein:

the amplifier circuit comprises a plurality of first bipolar transistors that are cascade-connected to each other; and the resistor voltage divider circuit is connected to the power supply terminal via the collector of the first bipolar transistor of an initial stage of the plurality of first bipolar transistors.

10. The power amplifier circuit according to claim 1, wherein the control circuit is configured to change the upper limit of the control current in accordance with a frequency band of the input signal.

11. The power amplifier circuit according to claim 2, wherein the control circuit is configured to change the threshold voltage in accordance with the rated power supply voltage of the power supply terminal.

12. The power amplifier circuit according to claim 3, wherein the control circuit is configured to change the threshold voltage in accordance with the rated power supply voltage of the power supply terminal.

13. The power amplifier circuit according to claim 5, wherein the control circuit is configured to change the threshold voltage in accordance with the rated power supply voltage of the power supply terminal.

* * * * *

UNITED STATES PATENT AND TRADEMARK OFFICE
CERTIFICATE OF CORRECTION

Page 1 of 1

PATENT NO. : 12,294,336 B2
APPLICATION NO. : 17/650689
DATED : May 6, 2025
INVENTOR(S) : Masakazu Hirobe It is certified that error appears in the above-identified patent and that said Letters Patent is hereby corrected as shown below:

In the Specification

Column 7, Line 67, "re-channel MOSFET 542" should be --n-channel MOSFET 542--

Column 8, Line 1, "re-channel MOSFETs 543" should be --n-channel MOSFETs 543--

Column 8, Line 40, "re-channel MOSFET 544" should be --n-channel MOSFET 544--

Column 13, Line 12, "re-channel MOSFET 71" should be --n-channel MOSFET 71--

Column 13, Line 19, "n re-channel MOSFETs 721" should be --n n-channel MOSFETs 721--

Column 13, Line 20, "m re-channel MOSFETs 731" should be --m n-channel MOSFETs 731--

Signed and Sealed this
Fifteenth Day of July, 2025

Coke Morgan Stewart
*Acting Director of the United States Patent and Trademark Office*